US007012840B2

(12) United States Patent
Kang

(10) Patent No.: US 7,012,840 B2
(45) Date of Patent: Mar. 14, 2006

(54) SEMICONDUCTOR MEMORY DEVICE HAVING VOLTAGE DRIVING CIRCUIT

(75) Inventor: Chang-Seok Kang, Ichon-shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/874,742

(22) Filed: Jun. 24, 2004

(65) Prior Publication Data
US 2005/0141288 A1    Jun. 30, 2005

(30) Foreign Application Priority Data
Oct. 29, 2003    (KR) .................... 10-2003-0075969

(51) Int. Cl.
*G11C 7/00*    (2006.01)
(52) U.S. Cl. ..................... 365/189.09; 365/189.11; 365/226; 365/227; 365/229
(58) Field of Classification Search ........... 365/189.09, 365/189.11, 226, 227, 229
See application file for complete search history.

(56) References Cited

U.S. PATENT DOCUMENTS 5,295,112 A * 3/1994 Taniguchi ................ 365/227
5,463,588 A * 10/1995 Chonan ..................... 365/226
6,038,186 A *  3/2000 Tanizaki .................... 365/222
6,249,461 B1 * 6/2001 Choi et al. .............. 365/185.33
6,744,689 B1 * 6/2004 Itou .......................... 365/228
6,751,132 B1 * 6/2004 Jang et al. ............ 365/189.09
6,853,592 B1 * 2/2005 Kashiwazaki .......... 365/189.09

* cited by examiner

*Primary Examiner*—Zandra V. Smith
*Assistant Examiner*—Anthan Tran
(74) *Attorney, Agent, or Firm*—Mayer, Brown, Rowe & Maw LLP

(57) ABSTRACT

The present invention relates to a semiconductor memory device having a voltage driving circuit. The semiconductor memory device includes: a core voltage node; a first driving unit having a first controller for comparing a feedback voltage level of the core voltage node with a reference voltage to output a first control signal, and a first pull-up driver for pulling up the core voltage node; a second driving unit having a second controller driven in response to the active signal as an enable signal to compare the feedback voltage level of the core voltage node with the reference voltage to output a second control signal, and a second pull-up driver for pulling up the core voltage node; and a selecting unit for selectively outputting the first control signal and the second control signal in response to the active signal as a select signal, in which the first pull-up driver is driven in response to the first control signal and the second pull-up driver is driven in response to an output signal of the selecting means.

10 Claims, 6 Drawing Sheets

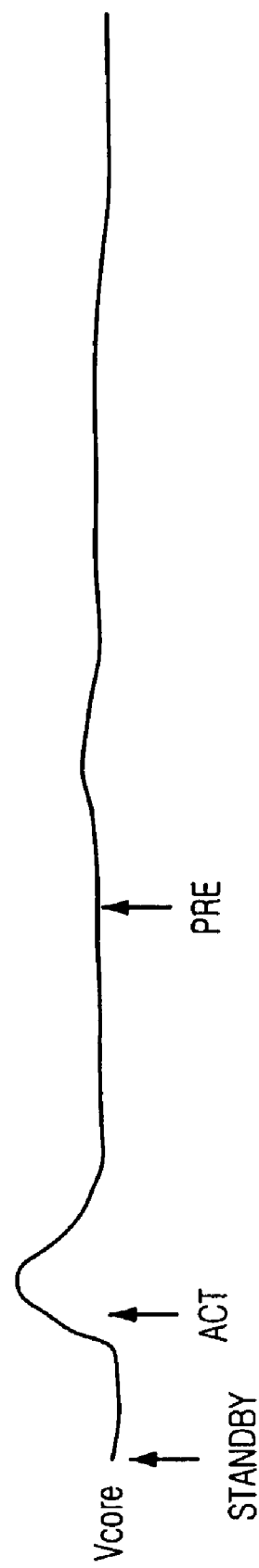

SEMICONDUCTOR MEMORY DEVICE HAVING VOLTAGE DRIVING CIRCUIT

FIELD OF THE INVENTION

The present invention relates to a semiconductor design technique; and, more particularly, to a semiconductor memory device having a voltage driving circuit.

DESCRIPTION OF THE PRIOR ART

Generally, since an amount of current is differently consumed when a semiconductor memory device operates, the semiconductor memory device uses a different driver in each of a standby mode and an active mode activated by a command inputted from an external circuit.

In other words, since a fast response time is not required in the standby mode due to its small consumption current, a driver for the standby mode is used with a small driving capability. Since the fast response time is required in the active mode due to its large consumption current, a driver for the active mode is used with a large driving capability.

FIG. 1 is a block diagram illustrating a conventional semiconductor memory device having a voltage driving circuit.

Referring to FIG. 1, the semiconductor memory device includes a memory cell array block 10; a bit line sense-amplifier array block 20 for sensing and amplifying a voltage difference of bit line pairs BL and /BL of the memory cell array block 10; a standby driving unit 30 for supplying a core voltage Vcore to the memory cell array block 10 and the bit line sense-amplifier array block 20; and an active driving unit 40 for additionally supplying the core voltage Vcore when an active signal ACT is activated.

An operation of the semiconductor memory device will now be described.

Only the standby driving unit 30 is used to supply current in the standby mode. Hereafter, if the active signal ACT is activated, the core voltage Vcore is supplied using the active driving unit 40 in addition to the standby driving unit 30.

Meanwhile, in the conventional semiconductor memory device, the core voltage is unstable after the active mode. This phenomenon will be described with reference to FIG. 2.

FIG. 2 is an operation waveform of the circuit shown in FIG. 1.

Referring to FIG. 2, in the standby mode, the core voltage is stably supplied using the standby driving unit 30. Then, if the active signal ACT is activated, the core voltage Vcore is supplied using the standby driving unit 30 and the active driving unit 40, and a level of the core voltage Vcore temporarily rises. The active driving unit 40 and the standby driving unit 30 prevent the voltage drop of the core voltage Vcore from being caused by the current consumption of the memory cell array block 10 and the bit line sense-amplifier block 20, thereby maintaining the stable level of the core voltage Vcore. Thereafter, if a precharge signal PRE is activated, the core voltage Vcore is supplied by only the standby driving unit 30.

Meanwhile, if the precharge signal PRE is activated, the current is supplied by only the standby driving unit 30. Therefore, it takes a predetermined time until the level of the core voltage Vcore is stabilized.

A phenomenon that the level of the core voltage Vcore rises for a predetermined time after the activation of the active signal ACT is based on an overdriving scheme, which is used when the semiconductor memory device is in the active mode.

The above drawback can be solved by increasing a size of the driver contained in the standby driving unit 30 or using a reservoir capacitor. However, this causes an additional drawback in that the semiconductor memory device is increased in area.

SUMMARY OF THE INVENTION

It is, therefore, an object of the present invention to provide a semiconductor memory device having a voltage driving circuit, which is capable of stably supplying a core voltage when the semiconductor memory device is in a standby mode after an active operation, without increasing an area of the voltage driving circuit.

In accordance with one aspect of the present invention, there is provided a semiconductor memory device including: a semiconductor memory device, which comprises: a core voltage node; a first driving means including a first controlling unit for comparing a feedback voltage level of the core voltage node with a reference voltage to output a first control signal, and a first pull-up driver for pulling up the core voltage node; a second driving means including a second controlling unit driven in response to the active signal as an enable signal to compare the feedback voltage level of the core voltage node with the reference voltage to output a second control signal, and a second pull-up driver for pulling up the core voltage node; and a selecting means for selectively outputting the first control signal and the second control signal in response to the active signal as a select signal, wherein the first pull-up driver is driven in response to the first control signal and the second pull-up driver is driven in response to an output signal of the selecting means.

BRIEF DESCRIPTION OF THE DRAWINGS

The above and other objects and features of the present invention will become apparent from the following description of the preferred embodiments given in conjunction with the accompanying drawings, in which:

FIG. 4 is an operation waveform of the circuit shown in FIG. 3;

DETAILED DESCRIPTION OF THE PREFERRED EMBODIMENTS

Reference will now be made in detail to the preferred embodiments of the present invention, examples of which are illustrated in the accompanying drawings.

Figure 3:
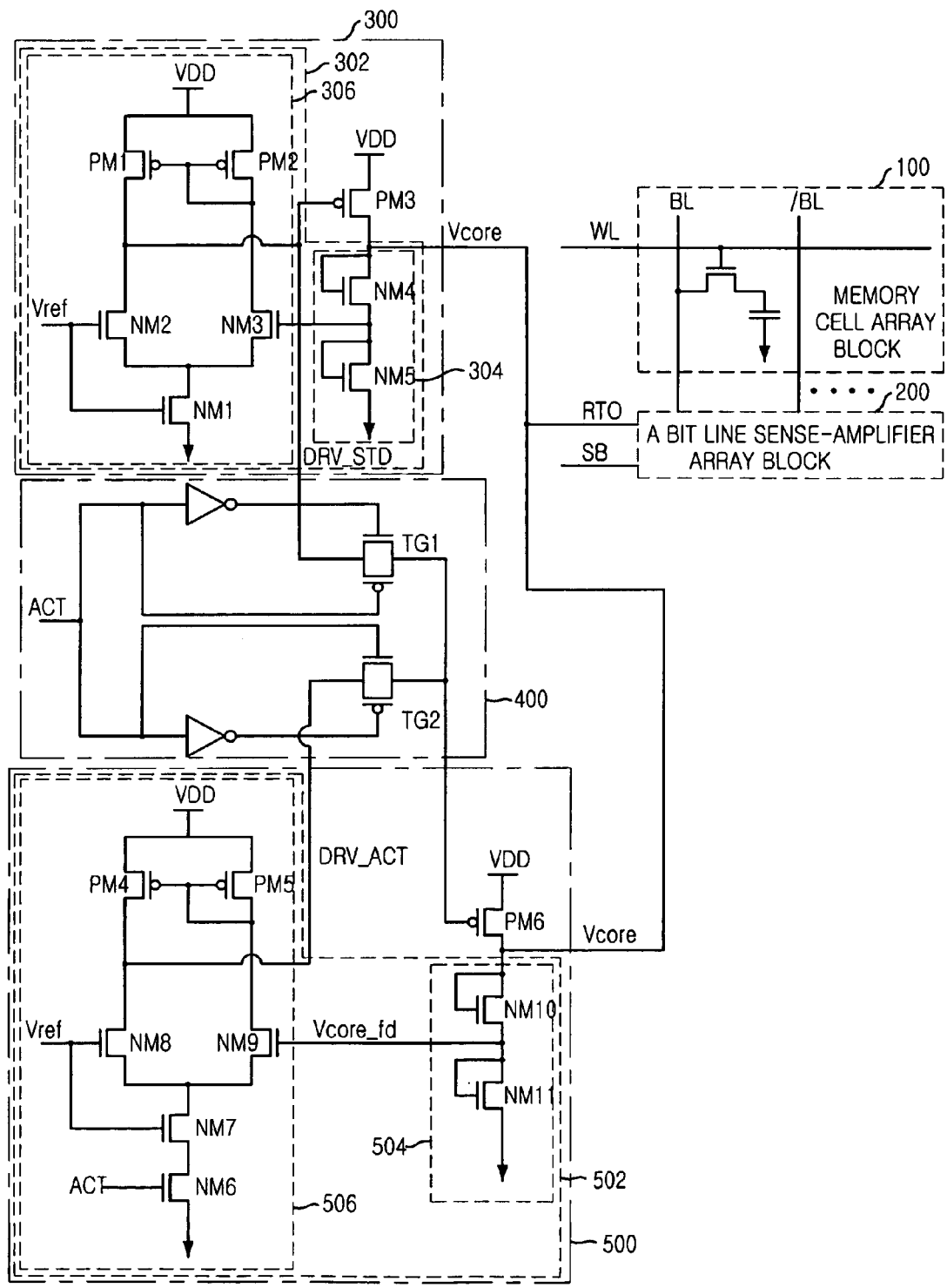
FIG. 3 is a circuit diagram of a semiconductor memory device having a voltage driving circuit in accordance with a preferred embodiment of the present invention.

FIG. 3 is a circuit diagram of a semiconductor memory device having a voltage driving circuit in accordance with a preferred embodiment of the present invention.

Referring to FIG. 3, the semiconductor memory device includes a memory cell array block 100; a bit line sense-amplifier array block 200 for sensing and amplifying a voltage difference of bit line pairs BL and /BL of the memory cell array block 100; a standby driving block 300 including a standby controlling unit 302 for comparing a predetermined feedback level of a core voltage Vcore with a reference voltage Vref to output a standby control signal DRV_STD, and a standby pull-up driver PM3 for supplying the core voltage Vcore to the memory cell array block 100 and the sense-amplifier array block 200 in response to the standby control signal DRV_STD; a selecting block 400 for selecting and outputting one of the standby control signal DRV-STD and an active control signal DRV_ACT in response to an active signal ACT; and an active driving block 500 including an active controlling unit 502 for comparing a predetermined feedback level of the core voltage Vcore with the reference voltage Vref to output the active control signal DRV_ACT, and an active pull-up driver PM6 for supplying the core voltage Vcore in response to an output of the selecting block 400.

In detail, the active controlling unit 502 includes a feedback core-voltage generator 504 for outputting a predetermined level of the core voltage Vcore as a feedback core voltage Vcore_fd, and a voltage-level detector 506 for comparing a level of the feedback core voltage Vcore_fd with the reference voltage Vref to output the active control signal (DRV_ACT).

The voltage-level detector 506 includes: current source transistors NM6 and NM7 for receiving the reference voltage Vref and the active signal ACT to apply bias voltages of differential input transistors NM8 and NM9; the differential-input transistors NM8 and NM9, connected to the current source transistors NM6 and NM7, for receiving the reference voltage Vref and the feedback core voltage Vcore_fd; and current mirrors PM4 and PM5 connected to the differential-input transistors NM8 and NM9. The voltage-level detector 506 outputs a drain voltage of the differential-input transistor NM8 as the active control signal DRV-ACT.

The feedback core-voltage generator 504 divides the core voltage Vcore through an active resistor, which is configured with NMOS transistors NM10 and NM11, and outputs the divided core voltage as the feedback core voltage Vcore_fd.

Further, the standby controlling unit 302 has the same circuit configuration as the active controlling unit 502. However, the standby controlling unit 302 is different from the active controlling unit 502 in that the standby controlling unit 302 always supplies the core voltage due to the absence of the control signal such as the active signal ACT, and outputs the standby control signal DRV_STD for controlling the driving of the standby driver PM3.

The selecting block 400 includes a transfer gate TG1 for outputting the standby control signal DRV_STD when the active signal ACT is inactivated, and a transfer gate TG2 for outputting the active control signal DRV_ACT by using the active signal (ACT) as an activation signal.

The reference voltage Vref is a constant voltage of the semiconductor memory device and has a stable level without variation of level due to the external environment.

FIG. 4 is an operation waveform of the circuit shown in FIG. 3.

An operation of the semiconductor memory device having the voltage driving circuit will be described with reference to FIG. 4.

Referring to FIG. 4, when the semiconductor memory device is in a standby mode, the core voltage Vcore is stably supplied using the active pull-up driver PM6 of the active driving block 500. The active pull-up driver PM6 is controlled using the output signals of the standby driving block 300 and the selecting bock 400. Next, if the active signal ACT is activated, the selecting block 400 outputs the active control signal DRV_ACT in response to the activated active signal ACT such that the active driving block 500 supplies the core voltage Vcore together with the standby driving block 300. The active driving block 500 and the standby driving block 300 prevent the core voltage Vcore from being dropped due to a current consumption of the memory cell array block 100 and the bit line sense-amplifier block 200, thereby maintaining a stable level of the core voltage Vcore. Then, if the active signal ACT is activated by an inactivation of a precharge signal PRE, the selecting block 400 outputs the standby control signal DRV_STD. Accordingly, since the core voltage Vcore is supplied from the active pull-up driver PM6, which is controlled under the control of the output signals of the standby driving block 300 and the selecting block 400, the core voltage Vcore has a stable level.

A phenomenon that the level of the core voltage Vcore rises for a predetermined time after the activation of the active signal ACT is based on an overdriving scheme used when the semiconductor memory device operates in the active mode.

In the standby mode, the present invention uses only the active pull-up driver PM6 of the active driving block 500 in addition to the standby driving block 300 to increase a size of the driver for supplying the core voltage Vcore, thereby stabilizing the level of the core voltage within a short time. Additionally, since the active pull-up driver PM6 is used in the active driving block 500, which is not activated in the standby mode, the semiconductor memory device is not increased in a total area. Further, a standby current is not increased since only the active pull-up driver PM6 is used without the driving of a voltage-level detector 506 for improving a response time in the active driving block 500.

Figure 1:
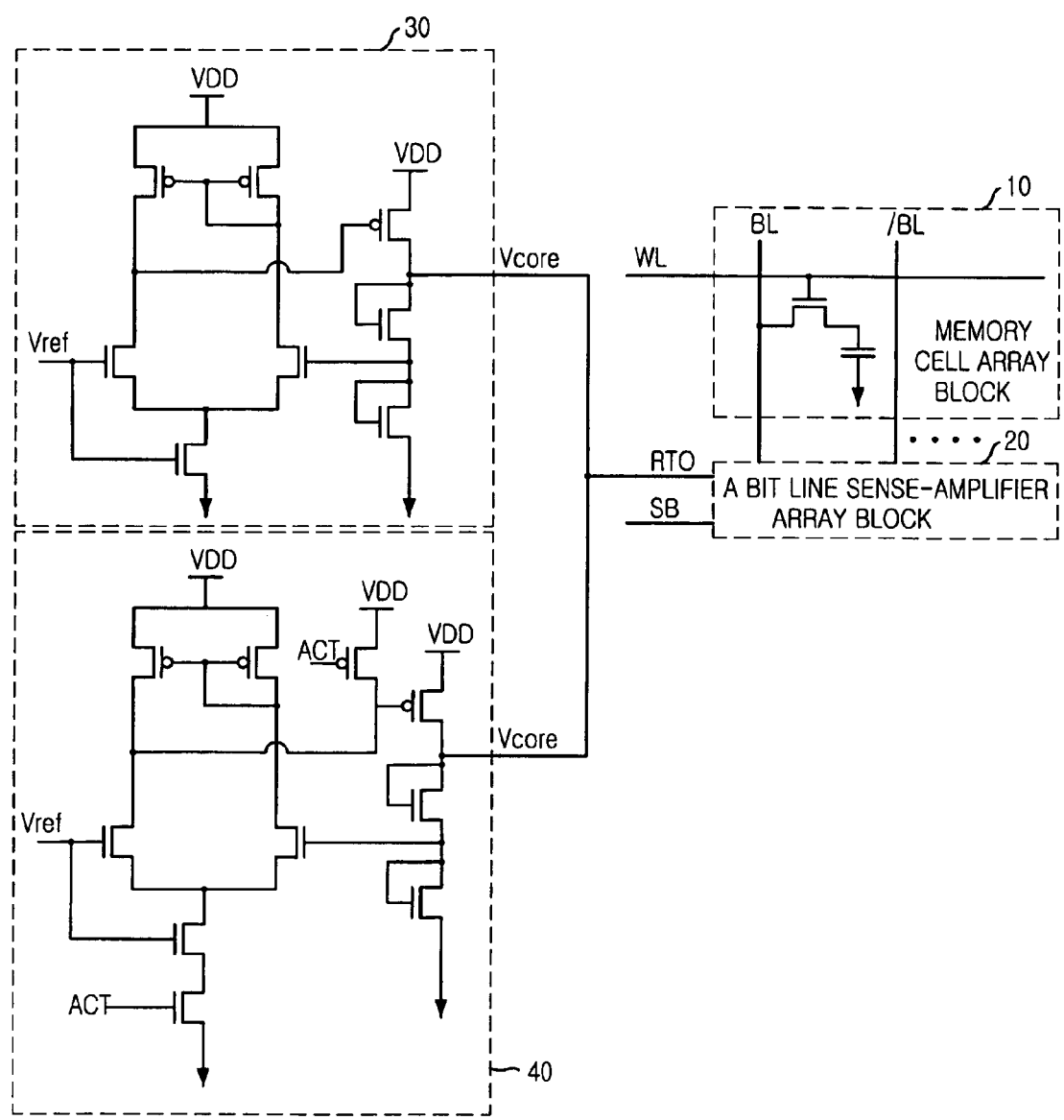
FIG. 1 is a circuit diagram of a conventional semiconductor memory device having a voltage driving circuit.
Figure 2:
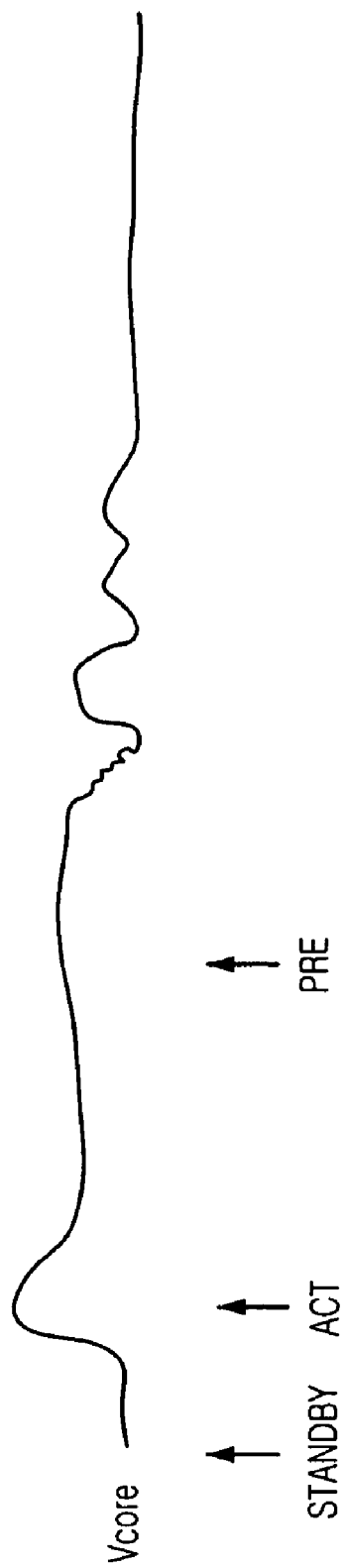
FIG. 2 is an operation waveform of the circuit shown in FIG. 1.
Figure 5A:
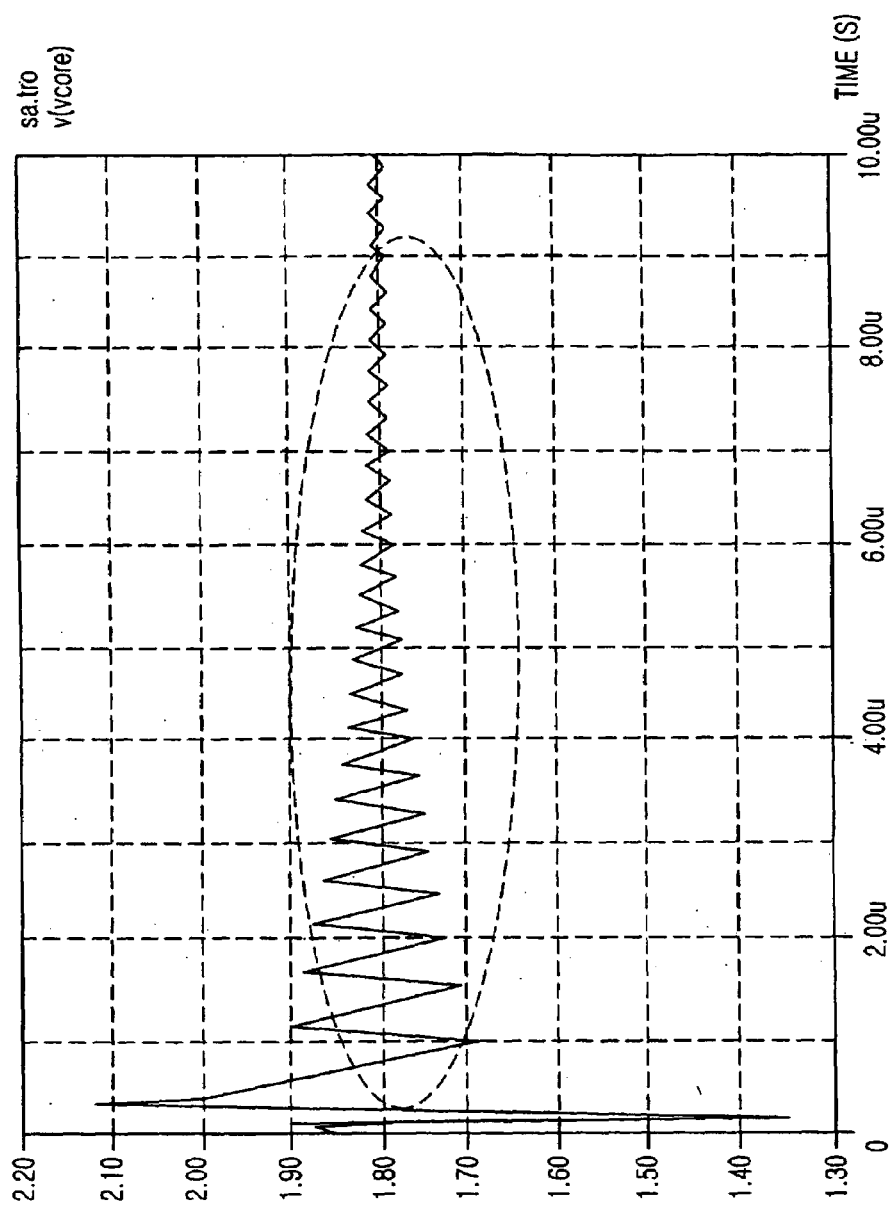
FIG. 5A illustrates a simulation result of the circuit shown in FIG. 1.

FIG. 5A is a simulation result of the circuit shown in FIG. 1.

An X-axis represents a time in a unit of $\mu$s, and a Y-axis represents a voltage in a unit of V.

Figure 5B:
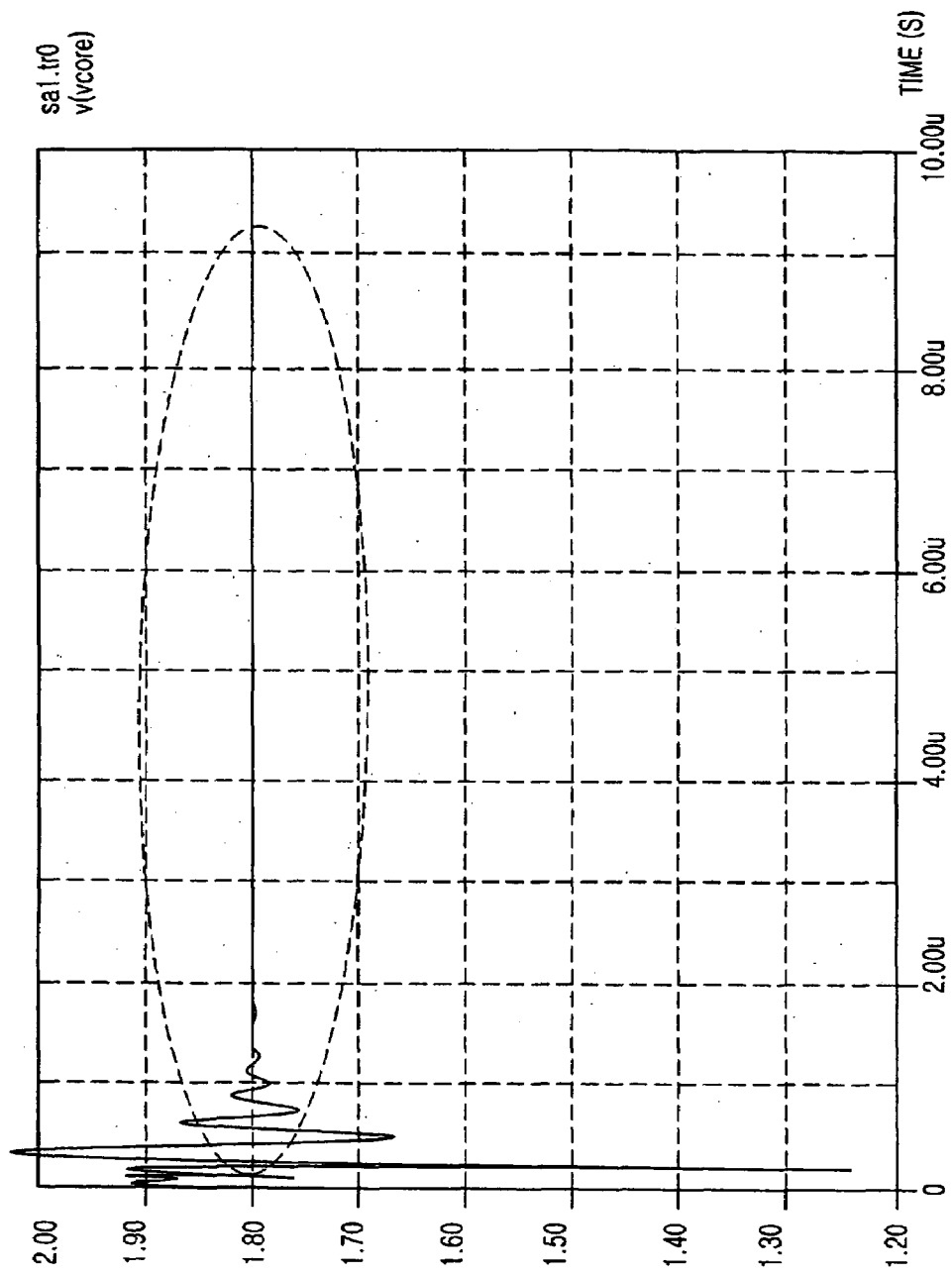
FIG. 5B illustrates a simulation result of the circuit shown in FIG. 3.

FIG. 5B is a simulation result of the circuit shown in FIG. 3 and has the same axes and units.

Referring to FIGS. 5A and 5B, after the active operation, the core voltage Vcore is in a range between 1.4 and 2.10 V and a time of 10.0 $\mu$s is taken up to the stable level in the conventional semiconductor memory device. However, the core voltage Vcore is in a range between 1.25 and 2.0 V and a time of 2.0 $\mu$s is taken up to the stable level in the semiconductor memory device in accordance with the present invention.

As described above, the present invention uses the driver, which is not driven in the standby mode, without increasing the area. Therefore, the core voltage can be stably supplied in the standby mode after the active mode.

The present application contains subject matter related to Korean patent applications No. 2003-75969, filed in the Korean Patent Office on Oct. 29, 2003, the entire contents of which being incorporated herein by reference.

While the present invention has been described with respect to the particular embodiments, it will be apparent to those skilled in the art that various changes and modifications may be made without departing from the scope of the invention as defined in the following claims.

What is claimed is:
1. A semiconductor memory device, comprising:
a core voltage node;
a first driving means including a first controlling unit for comparing a feedback voltage level of the core voltage node with a reference voltage to output a first control signal, and a first pull-up driver for pulling up the core voltage node;

a second driving means including a second controlling unit driven in response to the active signal as an enable signal to compare the feedback voltage level of the core voltage node with the reference voltage to output a second control signal, and a second pull-up driver for pulling up the core voltage node; and a selecting means for selectively outputting the first control signal and the second control signal in response to the active signal as a select signal, wherein the first pull-up driver is driven in response to the first control signal and the second pull-up driver is driven in response to an output signal of the selecting means.

2. The semiconductor memory device as recited in claim 1, wherein the selecting means outputs the second control signal in an active mode and the first control signal in a standby mode.

3. The semiconductor memory device as recited in claim 1, wherein the active signal is activated in an active mode and inactivated in a standby mode.

4. The semiconductor memory device as recited in claim 1, wherein the selecting means includes:
a first transfer gate for transferring the first control signal when the active signal is inactivated; and
a second transfer gate for transferring the second control signal when the active signal is activated.

5. The semiconductor memory device as recited in claim 1, wherein the first pull-up driver is a PMOS transistor having a source and a drain connected between a power supply terminal and the core voltage node and a gate receiving the first control signal.

6. The semiconductor memory device as recited in claim 1, wherein the second pull-up driver is a PMOS transistor having a source and a drain connected between a power supply terminal and the core voltage node and a gate receiving an output of the selecting means.

7. The semiconductor memory device as recited in claim 1, wherein the second controlling means includes:
a feedback core-voltage generating unit for transmitting a voltage level of the core voltage node to a feedback core voltage; and
a voltage-level detecting unit for comparing a level of the feedback core voltage with a level of the reference voltage in response to the active signal to output the second control signal.

8. The semiconductor memory device as recited in claim 1, wherein the first control unit includes:
a feedback core-voltage generating unit for transmitting the voltage level of the core voltage node as a feedback core voltage; and
a voltage-level detecting unit for comparing a level of the feedback core voltage with a level of the reference voltage in response to the active signal to output the first control signal.

9. The semiconductor memory device as recited in claim 7, wherein the voltage-level detecting unit includes:
current source transistors having gates receiving the active signal and the reference voltage, respectively;
differential input transistors, connected to the current source transistors, having gates receiving voltage levels of the reference voltage and the feedback core voltage, respectively; and
a current mirror, connected to the differential input transistors, for outputting the second control signal.

10. The semiconductor memory device as recited in claim 7, wherein the feedback core-voltage generating unit is an active resistor configured with MOS transistors and outputs the feedback core voltage having a predetermined level of the core voltage.

* * * * *